United States Patent
Ishida et al.

(10) Patent No.: US 8,443,513 B2
(45) Date of Patent: May 21, 2013

(54) SUBSTRATE PROCESSING APPARATUS

(75) Inventors: Seiki Ishida, Kumamoto (JP); Yukiyoshi Saito, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 343 days.

(21) Appl. No.: 12/895,576

(22) Filed: Sep. 30, 2010

(65) Prior Publication Data
US 2011/0078898 A1    Apr. 7, 2011

(30) Foreign Application Priority Data

Oct. 6, 2009   (JP) .................................. 2009-232769
Aug. 12, 2010  (JP) .................................. 2010-180921

(51) Int. Cl.
*G03D 5/04*   (2006.01)
*G03D 5/00*   (2006.01)
*G03B 27/32*  (2006.01)

(52) U.S. Cl.
USPC ............. 29/771; 414/221; 414/277; 414/935; 414/217; 29/783; 29/791; 396/611; 396/612

(58) Field of Classification Search
USPC .................... 29/739, 771, 783, 791; 414/217, 414/221, 277, 935; 396/611, 612
See application file for complete search history.

(56) References Cited

U.S. PATENT DOCUMENTS

| | | | | |
|---|---|---|---|---|
| 6,161,969 A | * | 12/2000 | Kimura et al. | 396/611 |
| 6,377,329 B1 | * | 4/2002 | Takekuma | 355/27 |
| 7,934,880 B2 | * | 5/2011 | Hara et al. | 396/611 |
| 2006/0024446 A1 | * | 2/2006 | Sugimoto et al. | 427/377 |
| 2011/0043773 A1 | * | 2/2011 | Matsuoka | 355/27 |

FOREIGN PATENT DOCUMENTS

| | | |
|---|---|---|
| JP | 2008-034490 A | 2/2008 |
| JP | 2008-258209 A | 10/2008 |

* cited by examiner

*Primary Examiner* — Peter DungBa Vo
*Assistant Examiner* — Anthony Green
(74) *Attorney, Agent, or Firm* — Abelman, Frayne & Schwab

(57) ABSTRACT

Disclosed is a substrate processing apparatus which can achieve an improvement in throughput and suppress the reduction in the operation rate of the entire apparatus even when a problem occurs. In the disclosed apparatus, at the rear end of a substrate loading block including a loading/unloading arm for transferring a wafer to a carrier, a first, a second, and a third processing blocks are disposed in that order. In the substrate loading block, transfer stages are provide for transferring a wafer from the loading/unloading arm to the first processing block, for transferring a wafer to the second processing block, and for transferring a wafer to the third processing block so that the wafer on the transfer stage is directly carried to the second processing block by a first direct carrying mechanism, and to the third processing block by a second direct carrying mechanism.

11 Claims, 10 Drawing Sheets

SUBSTRATE PROCESSING APPARATUS

This application is based on and claims priority from Japanese Patent Applications No. 2009-232769, filed on Oct. 6, 2009, and No. 2010-180921, filed on Aug. 12, 2010, with the Japanese Patent Office, the disclosures of which are incorporated herein in those entirety by reference.

TECHNICAL FIELD

The present disclosure relates to a substrate processing apparatus including a block for taking out a substrate from a carrying container and a processing block including a plurality of processing units to perform a single-type processing on the substrate.

BACKGROUND

In a fabrication process of a semiconductor device or the like, a liquid processing is carried out in which a processing liquid such as a chemical liquid, deionized water or the like is supplied to the surface of a substrate such as a semiconductor wafer (hereinafter, referred to as a wafer) so as to remove particles or contaminants attached on the substrate.

As one liquid processing apparatus to perform such a liquid processing, there is a liquid processing apparatus in which substrates are disposed one by one on a spin chuck, and a liquid processing is performed through the supply of a processing liquid to the surface of the substrate while the substrate is rotated. As an example of this kind of liquid processing apparatus, there is an apparatus in which substrates are carried to a plurality of liquid processing units capable of performing the same kind of liquid processing on a substrate by using a common substrate carrying means, and thus the substrates are sequentially replaced while liquid processing are simultaneously in the plurality of liquid processing units, so as to improve the number of processed substrates (throughput) per unit time. For example, see Japanese Laid-Open Patent Publication No. 2008-34490 (refer to paragraph [0020] and FIG. 1).

The inventor of the present disclosure has investigated further improvement of throughput in a liquid processing apparatus having such a structure. In this case, when the number of mounted liquid processing units is increased, the number of substrates which can be simultaneously processed is increased, thereby improving the throughput. However, in a case where the number of liquid processing units in one liquid processing apparatus is increased as described above, for example, when there is a problem in each of the liquid processing units, a substrate carrying mechanism or a processing liquid supply system for the liquid processing units, it is required to stop the entire liquid processing apparatus, thereby increasing the loss.

Herein, Japanese Laid-Open Patent Publication No. 2008-258209 (e.g., FIGS. 1 to 3 and FIG. 7) discloses a coating and developing apparatus for performing a series of processing such as a coating processing of a coating liquid, a heat processing, and a developing processing after an exposure. In the coating and developing apparatus, processing blocks in which a processing unit or a substrate carrying means is disposed with the same configuration are provided to be connected to each other and the number of the processing blocks is increased/decreased, so that it is possible to design or manufacture the apparatus according to a required throughput.

However, in this configuration, when a wafer W is transferred from a carrier block S1 to a third processing block S4, wafer W is firstly transferred to a second processing block S3 by a shuttle arm G1 of a first processing block S2 and then is transferred to third processing block S4 by a shuttle arm G2 of second processing block S3. For this reason, when there is a problem in a module or a carrying means of second processing block S3, wafer W cannot be transferred to third processing block S4. Thus, although the technology disclosed in Japanese Laid-Open Patent Publication No. 2008-258209 is applied, it may be impossible to efficiently drive a liquid processing apparatus.

SUMMARY

According to one embodiment, there is provided a substrate processing apparatus including: a substrate loading block comprising a container placing unit in which a substrate carrying container storing at least a substrate is disposed and a transfer mechanism to transfer the substrate with respect to the substrate carrying container disposed on the container placing unit; a first processing block, a second processing block, and a third processing block disposed in order from the side of the substrate loading block, each of which is a processing block including a plurality of processing units to perform processing on the substrate, and a substrate carrying mechanism to transfer the substrate with respect to the processing units; a first transfer stage to transfer the substrate from the transfer mechanism to the first processing block; a first direct carrying mechanism to directly carry the substrate taken from the transfer mechanism to the second processing block; and a second direct carrying mechanism to directly carry the substrate taken from the transfer mechanism to the third processing block.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
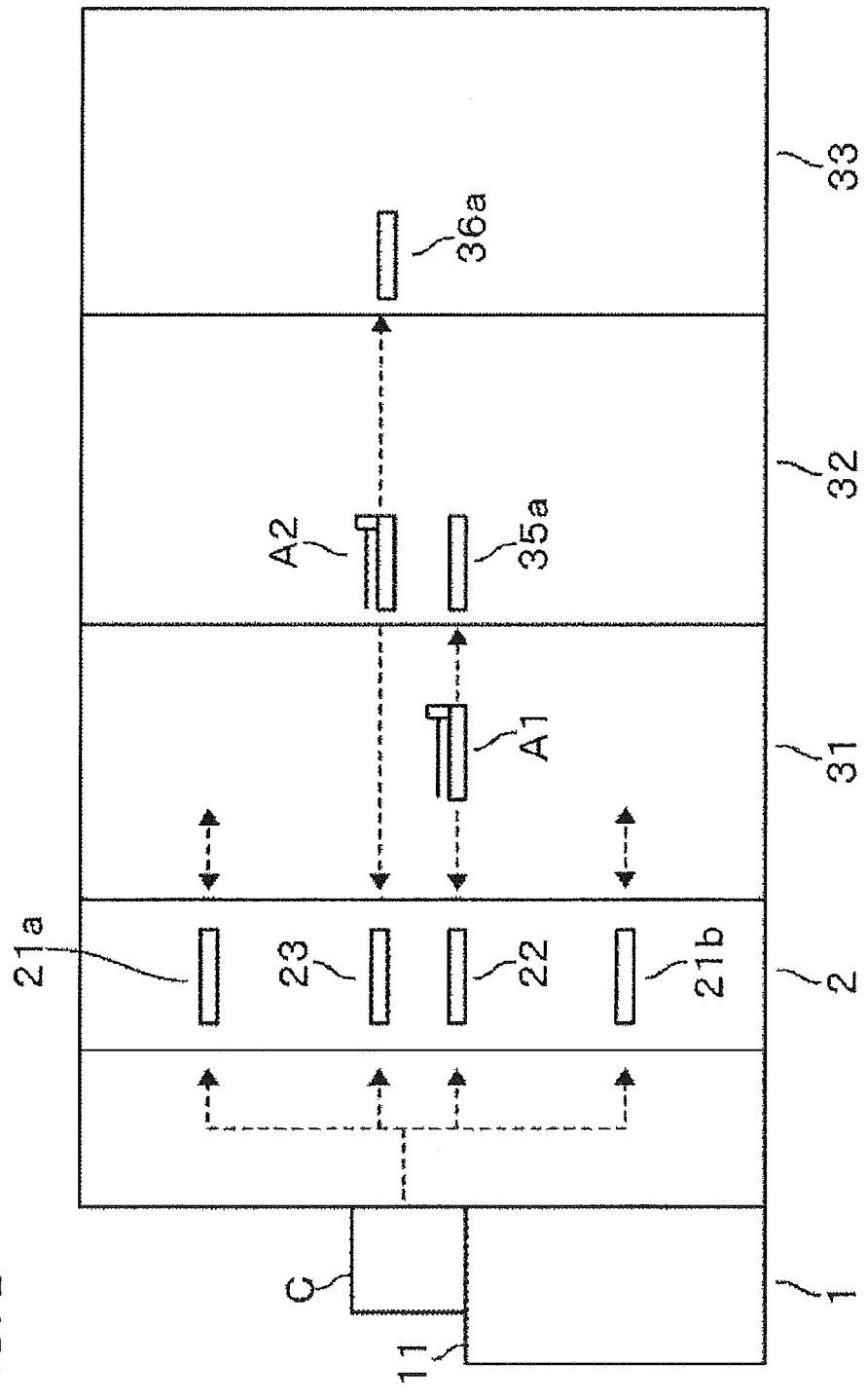
FIG. 1 is a schematic vertical-sectional side view illustrating a liquid processing apparatus according to one exemplary embodiment of the present disclosure.

In the following detailed description, reference is made to the accompanying drawings, which form a part hereof. The illustrative embodiments described in the detailed description, drawings, and claims are not meant to be limiting. Other embodiments may be utilized, and other changes may be made, without departing from the spirit or scope of the subject matter presented here.

The present disclosure provides a substrate processing apparatus which can achieve an improvement in throughput and can inhibit the reduction in the operation ratio of the entire apparatus even if a problem occurs.

According to one embodiment of the present disclosure, there is provided a substrate processing apparatus comprising: a substrate loading block including a container placing unit in which a substrate carrying container storing at least a substrate is disposed and a transfer mechanism to transfer the substrate with respect to the substrate carrying container disposed on the container placing unit; a first processing block, a second processing block, and a third processing block disposed in order from the side of the substrate loading block, each of which is a processing block including a plurality of processing units to perform processing on the substrate, and a substrate carrying mechanism to transfer the substrate with respect to the processing units; a first transfer stage to transfer the substrate from the transfer mechanism to the first processing block; a first direct carrying mechanism to directly carry the substrate taken from the transfer mechanism to the second processing block; and a second direct carrying mechanism to directly carry the substrate taken from the transfer mechanism to the third processing block.

The substrate processing apparatus may comprise constitutions as described below. (a) The first processing block, the second processing block, and the third processing block may be disposed in a horizontal direction one another. (b) The second processing block may include a transfer stage to transfer the substrate from/to the first direct carrying mechanism, and the third processing block may include a transfer stage to transfer the substrates from/to the second direct carrying mechanism. (c) Each of the first processing block, the second processing block, and the third processing block may include an upper processing block and a lower processing block which are stacked each other, each of the upper processing block and the lower processing block may include a plurality of processing units to perform processing on the substrate, and a substrate carrying mechanism to transfer the substrate to the processing units, and each of the second processing block, and the third processing block may include an upper stage to which the substrate is transferred by the substrate carrying mechanism of the upper processing block, a lower stage to which the substrate is transferred by the substrate carrying mechanism of the lower processing block, and a vertical carrying mechanism to transfer the substrate carried by the first direct carrying mechanism or the second direct carrying mechanism to the upper stage or the lower stage. (d) Each of the first processing block, the second processing block, and the third processing block may include an upper processing block and a lower processing block which are stacked each other, each of the upper processing block and the lower processing block may include a plurality of processing units to perform processing on the substrates, and a substrate carrying mechanism to transfer the substrates to the processing units, and each of the second processing block, and the third processing block may include an upper stage to which the substrate is transferred by the substrate carrying mechanism of the upper processing block, a lower stage to which the substrate is transferred by the substrate carrying mechanism of the lower processing block, a vertical carrying mechanism to transfer the substrate carried by the first direct carrying mechanism or the second direct carrying mechanism to the upper stage or the lower stage, and a transfer stage to transfer the substrate between the substrate carried by the first direct carrying mechanism or the second direct carrying mechanism and the vertical carrying mechanism.

(e) The substrate processing apparatus may further comprise a transfer block between the substrate loading block and the first processing block. The transfer block may include the first transfer stage, a second transfer stage to transfer the substrate between the transfer mechanism and the first direct carrying mechanism, and a third transfer stage to transfer the substrate between the transfer mechanism and the second direct carrying mechanism. (f) Partition walls may be provided between the first processing block, the second processing block, and the third processing block, and each of the partition walls may include an opening allowing the substrate to be transferred to each processing block, by the first direct carrying mechanism or the second direct carrying mechanism. (g) A partition wall may be provided between the first processing block, and the second processing block, and the partition wall may include an opening allowing the substrate to be transferred to the second processing block by the first direct carrying mechanism and the second direct carrying mechanism to be passed through. (h) The substrate may be transferred between the substrate carrying mechanism comprised within the first processing block, and the first transfer stage. (i) The first direct carrying mechanism or the second direct carrying mechanism may be capable of carrying a plurality of substrates at once. (j) Each of the first direct carrying mechanism or the second direct carrying mechanism may have partition walls formed at upper side and at lower side.

According to the present disclosure, a substrate can be quickly transferred to a second processing block or a third processing block from a substrate loading block by carrying the substrate directly, independently of carrying of another processing block, thereby achieving an improvement of throughput. Also, even when a problem occurs in one processing block, it is possible to continue to carry out processing in other processing blocks, thereby suppressing the reduction in the operation ratio of the apparatus without stopping the entire apparatus.

Hereinafter, the configuration of a liquid processing apparatus 10 as a substrate processing apparatus according to exemplary embodiments of the present disclosure will be described with reference to the drawings. Liquid processing apparatus 10 supplies a processing liquid on a wafer W as a substrate, thereby performing a liquid processing of removing particles or contaminants attached on the substrate. First, the outline of the present disclosure will be briefly described with reference to FIG. 1. Liquid processing apparatus 10 of the present disclosure includes a carrier placing block 1 for loading/unloading a carrier C storing a plurality of wafers W from the outside, a transfer block 2 including a transfer unit of wafer W, and a plurality (e.g., 3) of different processing blocks (a first processing block 31, a second processing block 32, and a third processing block 33) for performing a predetermined liquid processing on wafer W. In case of making carrier placing block to be a front side, carrier placing block 1, transfer block 2, first processing block 31, second processing block 32, and third processing block 33 are disposed in a row in the front and rear directions and connected to each other.

In transfer block 2, first transfer stages 21a and 21b for transferring wafer W to first processing block 31, a second transfer stage 22 for transferring wafer W to second processing block 32, and a third transfer stage 23 for transferring wafer W to third processing block 33 are separately provided. Also, there are provided a first shuttle arm A1 that is a first direct carrying means dedicated to carrying of wafer W between second transfer stage 22 and second processing block 32 and a second shuttle arm A2 that is a second direct carrying means dedicated to carrying of wafer W between third transfer stage 23 and third processing block 33.

And, wafer W in second transfer stage 22 is directly carried to second processing block 32 by first shuttle arm A1 returned to second transfer stage 22 by shuttle arm A1 after a predetermined processing has been performed in the second processing block 32. In the same way, wafer W in third transfer stage 23 is directly carried to third processing block 33 by second shuttle arm A2 and returned to third transfer stage 23 by shuttle arm A2 after a predetermined processing has been performed in the third processing block 33. As described above, the present disclosure may be configured in such a way that wafer W is directly carried to second processing block 32 and third processing block 33 by dedicated shuttle arms A1 and A2 without another carrying means of a processing block.

Figure 2:
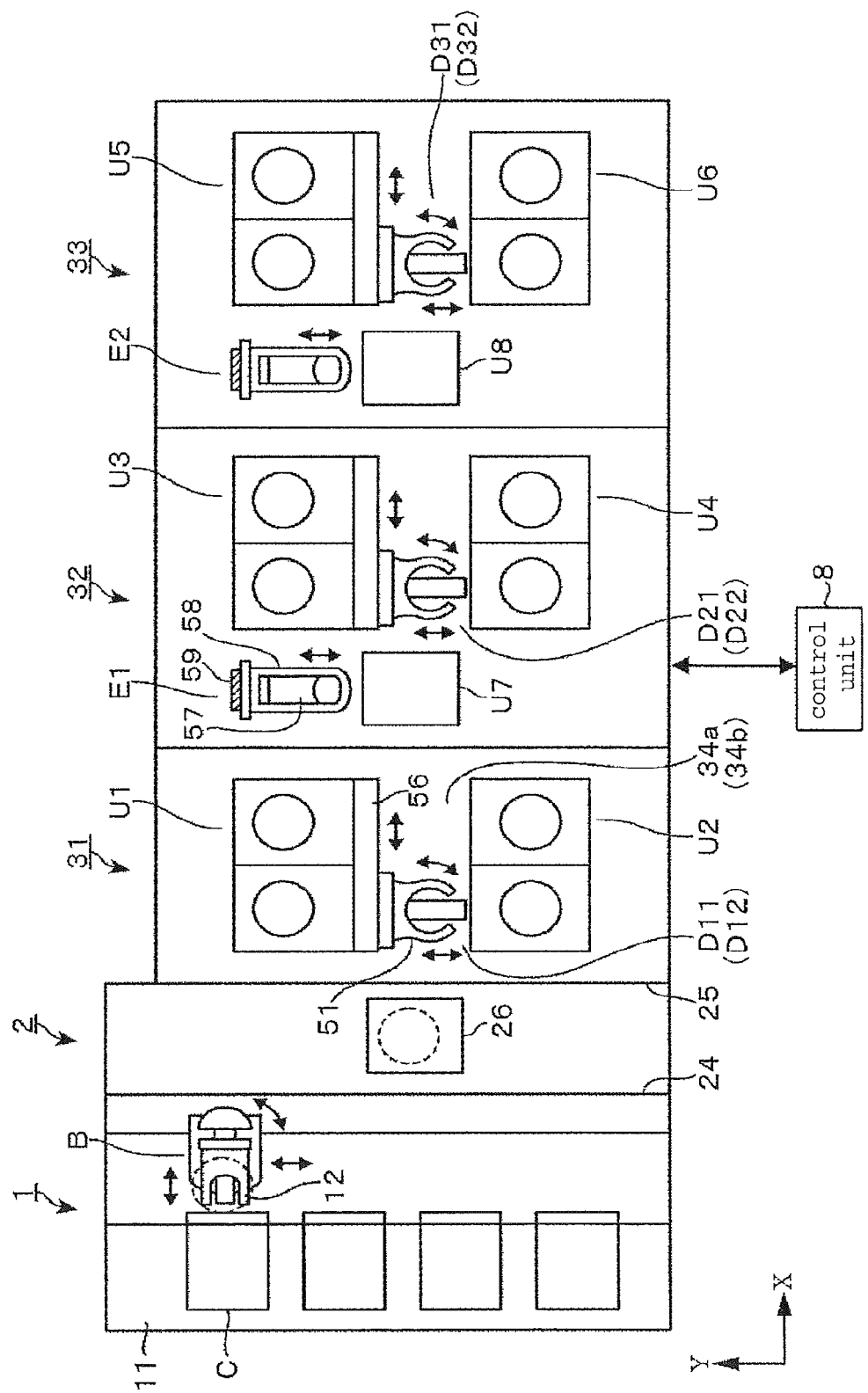
FIG. 2 is a cross-sectional plan view illustrating a liquid processing apparatus according to one exemplary embodiment of the present disclosure.
Figure 3:
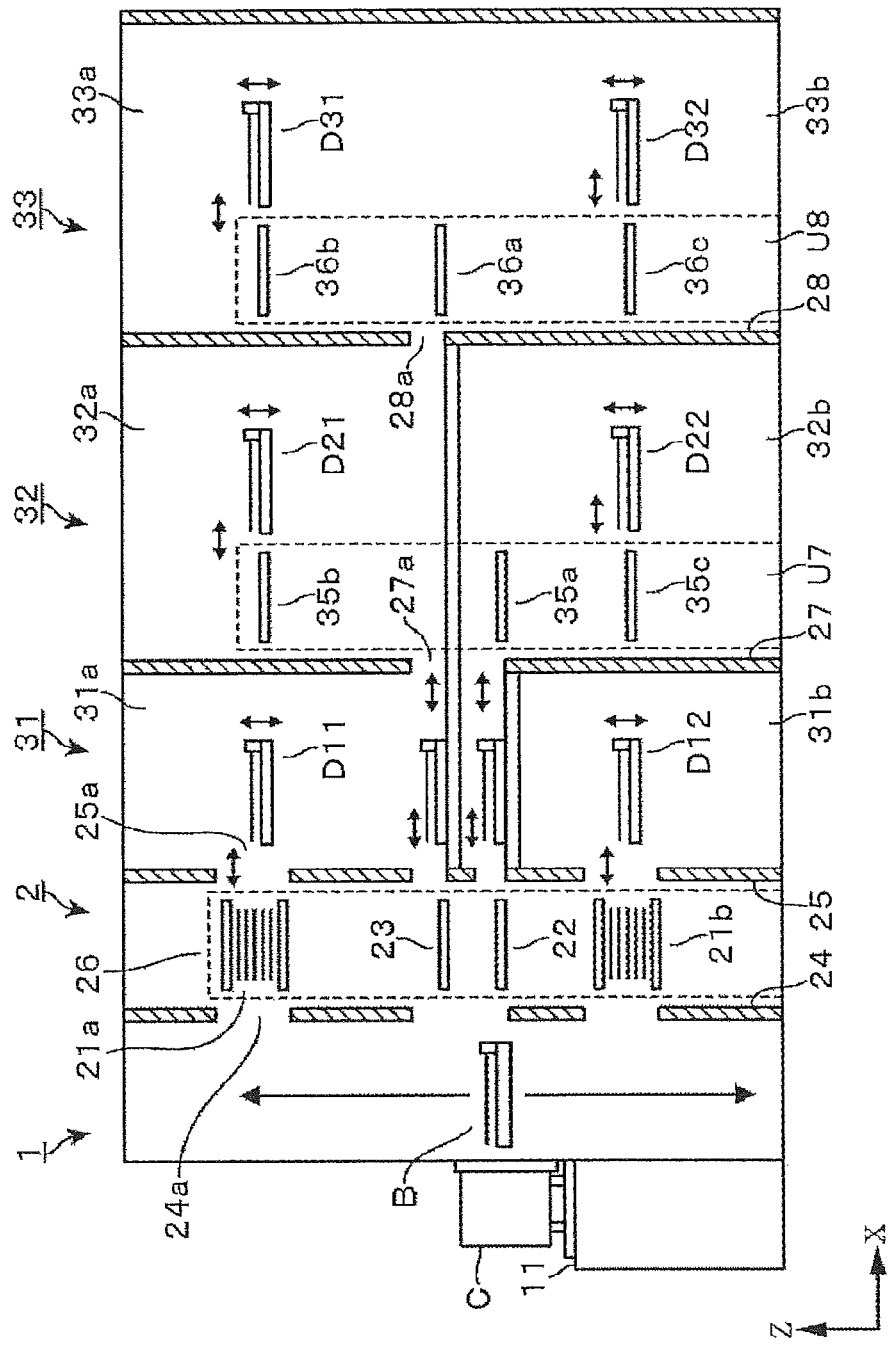
FIG. 3 is a vertical-sectional side view illustrating the liquid processing apparatus.

Hereinafter, the configuration of each block will be described with reference to FIGS. 2 to 7. FIG. 2 is a cross-sectional plan view illustrating the entire configuration of liquid processing apparatus 10, and FIG. 3 is a vertical-sectional side view. Carrier placing block 1 includes a container placing unit 11 on which, for example, 4 carriers C as substrate carrying containers are disposed. Carriers C disposed on container placing unit 11 are configured to open and close the cover of each carrier C and an open/close door provided in the interface connected to each carrier C by an open/close means (not shown). Also, carrier placing block 1 includes a loading/unloading arm B which is a transfer means for transferring wafer W between carriers C disposed on container placing unit 11 and transfer block 2.

Loading/unloading arm B is configured in such a way that a holding arm 12 for holding a wafer can be advanced/retreated in the front and rear directions, moved in the left and right directions (in the Y direction in FIG. 2), rotated, and moved up/down by a driving unit in order to access all carriers C and to access first to third transfer stages 21a, 21b, 22, and 23 provided in transfer block 2.

Transfer block 2 is a space within a case of which the front side and the rear side are provided at the position inserted between carrier placing block 1 and first processing block 31. For example, a transfer block has a structure in which first to third transfer stages 21a, 21b, 22, and 23 are included in multi-stages between a partition wall 24 provided between carrier placing block 1 and transfer block 2, and a partition wall 25 provided between transfer block 2 and first processing block 31.

For example, first to third transfer stages 21a, 21b, 22, and 23 are provided in multi-stages in a shared transfer shelf 26. In the present embodiment, first transfer stages 21a and 21b include an upper first transfer stage 21a provided in the upper side of transfer shelf 26 and a lower first transfer stage 21b provided in the lower side of transfer shelf 26, and second transfer stage 22 and third transfer stage 23 are provided in the center side of transfer shelf 26. It is configured that on each of first transfer stages 21a and 21b, for example, 8 wafers W are disposed, and on each of second and third transfer stages 22 and 23, for example, 1 wafer W is disposed. There are provided opening portions 24a in partition wall 24 and opening portions 25a in partition wall 25. Opening portions 24a are formed in the positions corresponding to first to third transfer stages 21a, 21b, 22, and 23, and are configured to access respective transfer stages 21a, 21b, 22, and 23 by loading/unloading arm B. Opening portions 25a are formed in the positions corresponding to first to third transfer stages 21a, 21b, 22, and 23, and are configured to access respective transfer stages 21a, 21b, 22, and 23 from first and second shuttle arms A1 and A2, and process arms D11 and D12 (described below) provided in first processing block 31. Carrier placing block 1 and transfer block 2, as described above, constitute a substrate loading block of the present embodiment.

Figure 4:
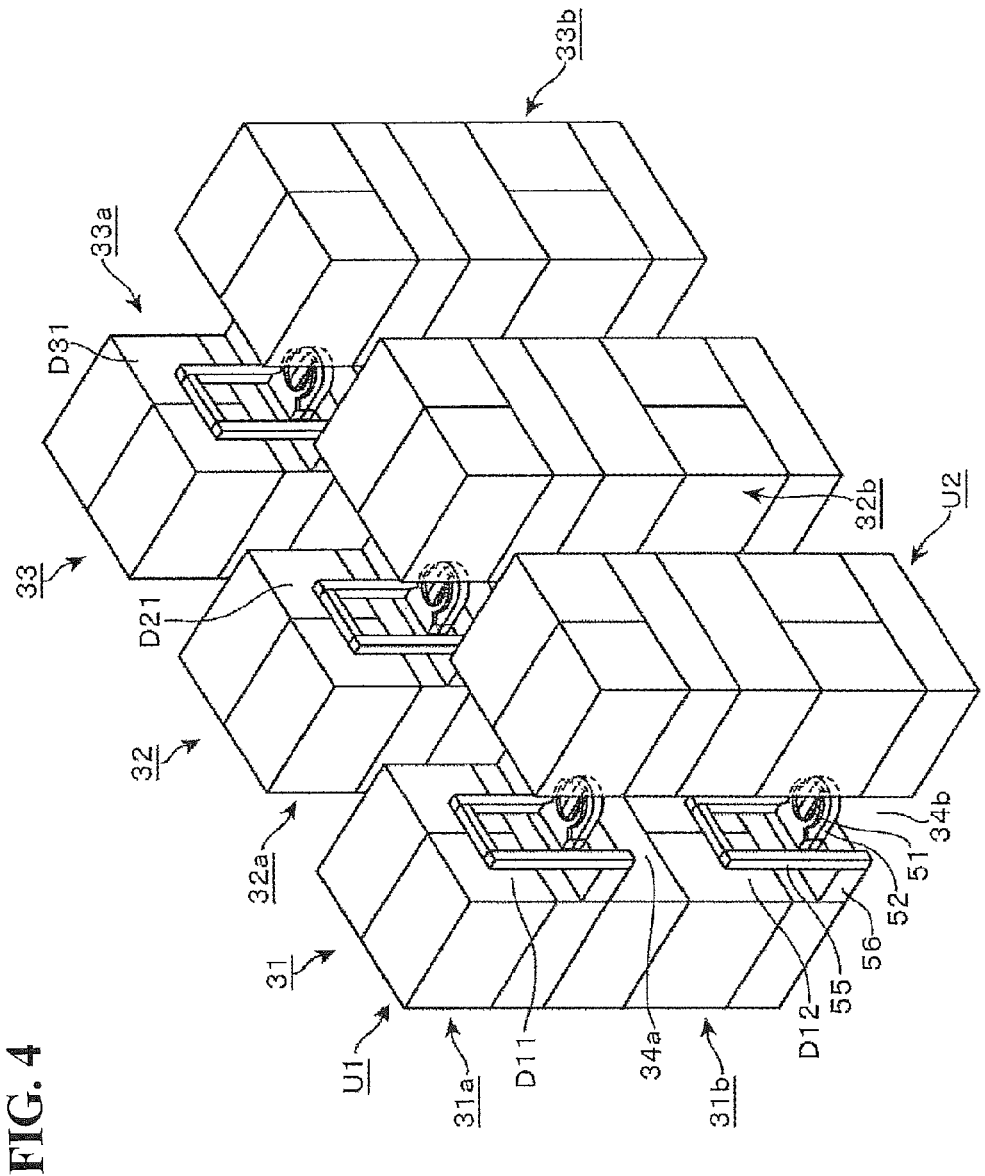
FIG. 4 is a perspective view illustrating a part of internal configuration of the liquid processing apparatus.

Hereinafter, first processing block 31 will be described. First processing block 31, as shown in FIG. 4, includes an upper processing block 31a and a lower processing block 31b layered on each other. In upper processing block 31a, a carrying route 34a, which is a straight-line carrying route of wafer W extending in the front and rear directions, is provided, and two liquid processing units 4 are provided respectively at the left side and the right side in such a way that they face each other across carrying route 34a from the perspective of carrier placing block 1. Also, lower processing block 31b is configured in the same way as upper processing block 31a, and two liquid processing units 4 are provided respectively at the left side and the right side in such a way that they face each other across a carrying route 34b of wafer W from the perspective of carrier seating block 1.

Then, liquid processing units 4 in upper processing block 31a and lower processing block 31b disposed at the left side of carrying route 34a are provided within the case, and are mounted in, for example, a shared shelf unit U1. Also, in the same way, liquid processing units 4 in upper processing block 31a and lower processing block 31b disposed at the right side of carrying route 34b are provided within the case, and are mounted in, for example, a shared shelf unit U2.

As shown in FIGS. 2 to 4, within each of carrying routes 34a and 34b, process arm D11 corresponding to a substrate carrying means of upper processing block 31a, and process arm D12 corresponding to a substrate carrying means of lower processing block 31b are provided above and below each other. Process arm D11 transfers wafer W to four liquid processing units 4 of upper processing block 31a, and the above mentioned upper first transfer stage 21a. Also, process arm D12 transfers wafer W to four liquid processing units 4 of lower processing block 31b, and the above mentioned lower first transfer stage 21b. In FIG. 4, for convenience of illustration, partition walls 27 and 28 for partitioning first processing block 31, second processing block 32, and third processing block 33, described below, are omitted.

Process arms D11 and D12 are attached, respectively, to the lower side of liquid processing unit 4 at the upper side, and to the lower side of liquid processing unit 4 at the lower side in wall surface toward carrying routes 34a and 34b in shelf unit U1. Since process arms D11 and D12 have the same configuration, process arm D12 is described by way of example with reference to FIGS. 4 and 5. Process arm D12 is configured in such a way that a holding arm 51 holding the backside circumferential periphery of wafer W can be advanced/retreated along a base 52, base 52 can be rotated around a vertical shaft on a support base 53 by a rotating mechanism 54, and support base 53 can be raised/lowered along a guide 55 extending in the up and down directions, and can be moved along a guide rail 56 provided in the wall surface toward carrying routes 34a and 34b in shelf unit U1.

Also, between upper processing block 31a and lower processing block 31b, a carrying area of first and second shuttle arms A1 and A2 is formed. First shuttle arm A1 corresponds to a first direct carrying means for carrying wafer W to second processing block 32, and second shuttle arm A2 corresponds to a second direct carrying means for carrying wafer W to third processing block 33. Thus, these shuttle arms A1 and A2 will be described in detail after the description of second processing block 32 and third processing block 33.

Hereinafter, second processing block 32 and third processing block 33 will be described. First to third processing blocks 31 to 33 have approximately the same configuration. In the same way as first processing block 31, second and third processing blocks 32 and 33 include upper processing blocks 32a and 33a, lower processing blocks 32b and 33b, upper process arms D21 and D31, and lower process arms D22 and D32. Also, shelf units U3 and U4 of second processing block 32 and shelf units U5 and U6 of third processing block 33, respectively, correspond to shelf units U1 and U2 of first processing block 31.

Hereinafter, different parts from those of first processing block 31 will be described. First, second processing block 32, as shown in FIGS. 2 and 3, includes a transfer shelf unit U7 in an area adjacent to first processing block 31. In transfer shelf unit U7, a second transfer stage 35a accessed by first shuttle arm A1, an upper stage 35b to which wafer W is transferred by upper process arm D21, and a lower stage 35c to which wafer W is transferred by lower process arm D22 are provided in multi-stages. Also, in order to transfer wafer W between these stages of transfer shelf unit U7, a vertical carrying mechanism E1 is provided.

Figure 6:
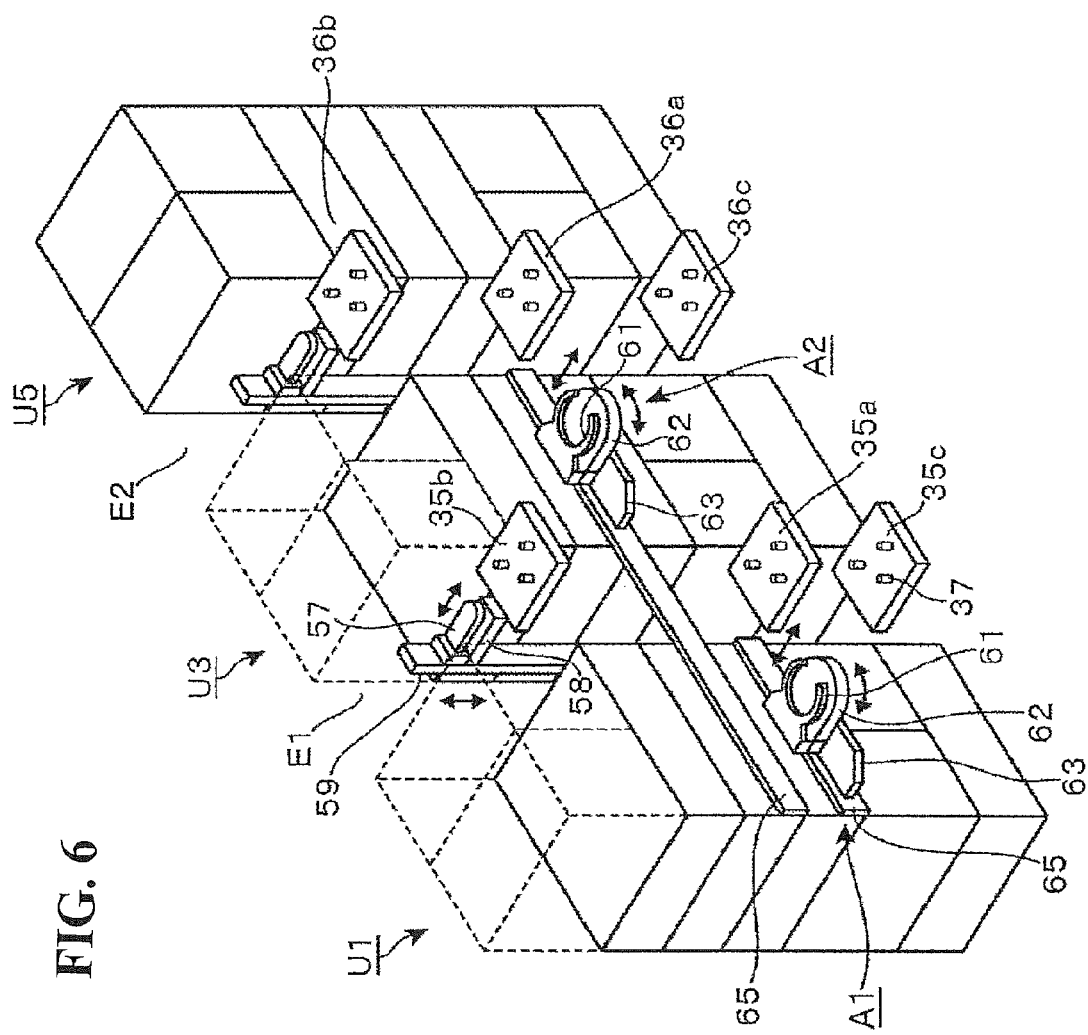
FIG. 6 is a perspective view illustrating a part of internal configuration of the liquid processing apparatus.

In this embodiment, for example, each of second transfer stage 35a, upper stage 35b, and lower stage 35c, as shown in FIG. 6, includes a plurality of (e.g., 3) supporting pins 37 for supporting the lateral side of wafer W. Also, in vertical carrying mechanism E1, as shown in FIGS. 2 and 6, for example, a holding arm 57 for holding the center portion of wafer W is provided along a base 58 so as to be advanced/retreated toward the stage side, and base 58 is configured to be raised/lowered along a vertically provided guide rail 59. Herein, the disposition of supporting pins 37 and the shape of holding arm 57 are set in such a way that holding arm 57 is able to enter up to a predetermined position in a condition without interference with supporting pins 37 of the stage when holding arm 57 is advanced. In FIG. 6, for convenience of illustration, partition walls 27 and 28 for partitioning first processing block 31, second processing block 32, and third processing block 33, and shelf units U2, U4, and U6, described below, are omitted. Also, for shelf units U7 and U8, only stages are illustrated.

Also, third processing block 33 includes a transfer shelf unit U8 in an area adjacent to second processing block 32, as shown in FIGS. 2 and 3. In transfer shelf unit U8, a third transfer stage 36a accessed by second shuttle arm A2, an upper stage 36b to which wafer W is transferred by upper process arm D31, and a lower stage 36c to which wafer W is transferred by lower process arm D32, are provided in multi-stages. Also, in order to transfer wafer W between these stages of transfer shelf unit U8, a vertical carrying mechanism E2 is provided. Third transfer stage 36a, upper stage 36b, lower stage 36c, and vertical carrying mechanism E2 have the same configuration as those of second processing block 32.

Also, partition wall 27 is provided between first processing block 31 and second processing block 32, and partition wall 28 is provided between second processing block 32 and third processing block 33. In partition wall 27, an opening portion 27a is formed so that first shuttle arm A1 can transfer wafer W to/from second transfer stage 35a of transfer shelf unit U7. Also, in partition wall 27, an opening portion 27b is formed to allow second shuttle arm A2 to be passed through. Openings of opening portions 27a and 27b are independent from each other, thereby having separated atmospheres.

Meanwhile, in partition wall 28, an opening portion 28a is formed so that second shuttle arm A2 can transfer wafer W from/to third transfer stage 36a of transfer shelf unit U8. By partitioning respective processing blocks 31 to 33 by respective partition walls 27 and 28 as described above, it is possible to separate atmospheres between respective processing blocks 31 to 33. Also, for example, repair of any one of processing blocks 31 to 33 has no effect for the rest of processing blocks. As a result, when a repair or the like is made, it is possible to continue to carry out substrate processing without stopping the entire liquid processing apparatus 10.

Figure 5:
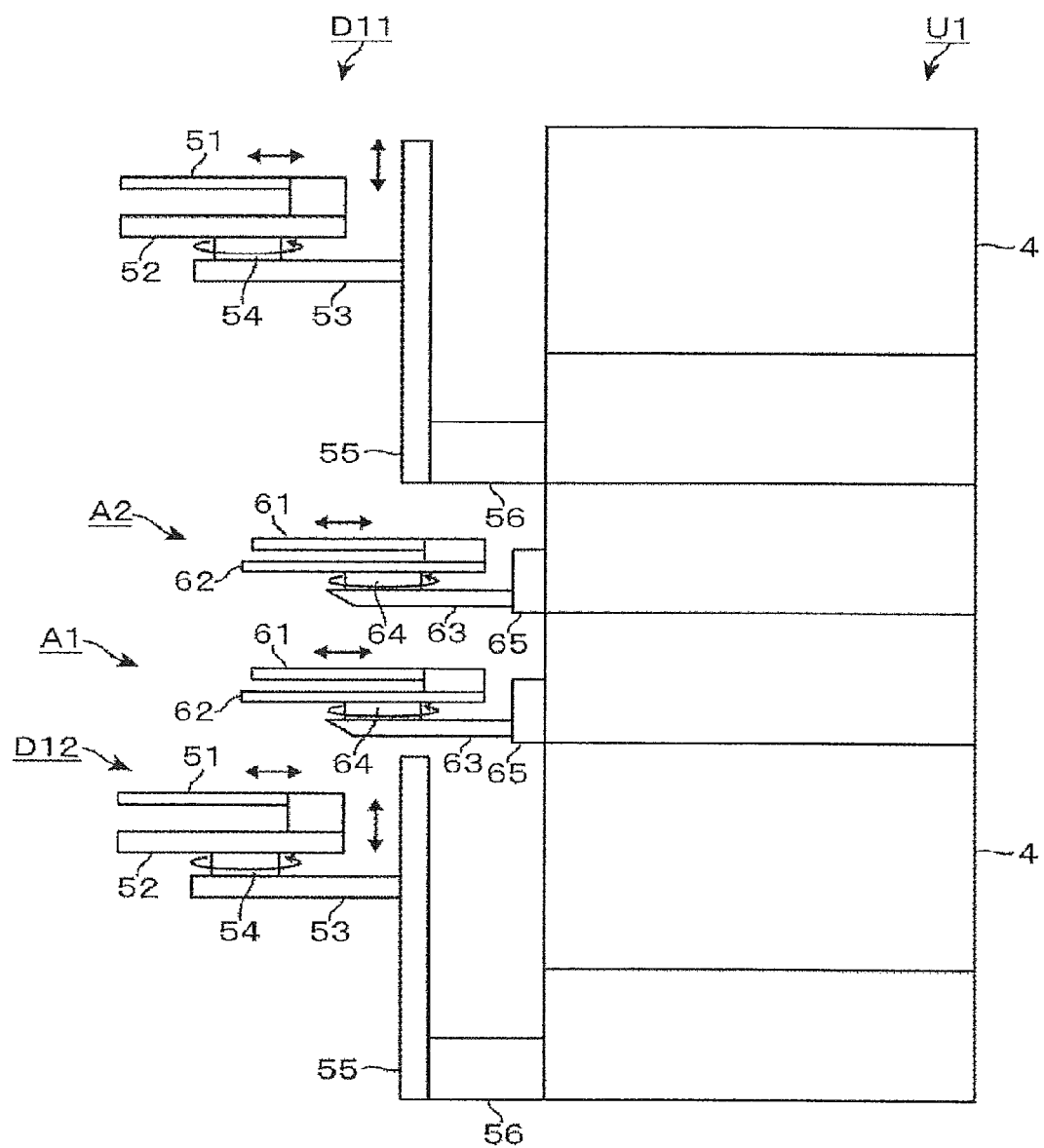
FIG. 5 is a side view illustrating a part of internal configuration of the liquid processing apparatus.

Hereinafter, first and second shuttle arms A1 and A2 will be described. First of all, first shuttle arm A1, for example, as shown in FIGS. 5 and 6, is provided between liquid processing units 4 at the lower side and the upper side in first processing block 31, at the position with no interference with process arms D11 and D12. Specifically, for example, first shuttle arm A1 is attached on a wall surface toward carrying route 34b in shelf unit U1, just above liquid processing unit 4 at the lower side. Also, a holding arm 61 for holding the backside circumferential periphery of wafer W is configured to be advanced/retreated along a base 62, base 62 is configured to be rotated around a vertical shaft on a support base 63 by a rotating mechanism 64, and also support base 63 is configured to be moved along a guide rail 65 provided in the wall surface of shelf unit U1. Also, first shuttle arm A1 transfers wafer W through opening portion 27a from/to second transfer stage 35a of transfer shelf unit U7.

Also, second shuttle arm A2, for example, as shown in FIGS. 5 and 6, is provided so as to be moved over first and second processing blocks 31 and 32, and is provided between liquid processing units 4 at the lower side and the upper side in these blocks 31 and 32, at the position with no interference with process arms D11, D12, D21, and D22. In this embodiment, for example, guide rail 65 of shuttle arm A2 is provided over shelf units U1 and U3, and is attached above the position where guide rail 65 of shuttle arm A1 is attached and below liquid processing unit 4 at the upper side. Shuttle arm A2 has the same configuration as the above described shuttle arm A1, except that guide rail 65 is provided over the wall surfaces of shelf units U1 and U3.

As described above, second shuttle arm A2 passes through first processing block 31 and second processing block 32 in order to directly carry wafer W between third transfer stage 23 of transfer block 2 and third transfer stage 36a of third processing block 33. For this reason, opening portion 27a formed in partition wall 27 between first processing block 31 and second processing block 32 has a size to allow second shuttle arm A2 to be passed through. Second shuttle arm A2 transfers wafer W through opening portion 28a, from/to third transfer stage 36a of transfer shelf unit U8. Also, in transfer shelf unit U7 of second processing block 32, an area is formed to allow second shuttle arm A2 to be passed through.

First and second shuttle arms A1 and A2 have a configuration in which although holding arm 61 is slightly raised/lowered when transferring wafer W from/to transfer stages, support base 63 is not raised/lowered. Thus, as shown in FIG. 5, first and second shuttle arms A1 and A2 are configured to be moved in the X direction in FIG. 3 in the areas between process arms D11 and D21 at the upper side and process arms D12 and D22 at the lower side without interference with these process arms D11, D12, D21, and D22.

Also, in the present embodiment, a shuttle arm partition wall 111 is provided above second shuttle arm A2 along guide rail 65 thereof. Also, a shuttle arm partition wall 112 is provided below second shuttle arm A2 along guide rail 65 thereof Also, a shuttle arm partition wall 113 is provided below first shuttle arm A1 along guide rail thereof Accordingly, first shuttle arm A1 and guide rail 65 of first shuttle arm A1 are provided in a space that is formed by shuttle arm partition wall 112 and shuttle arm partition wall 113 and separated from processing block 31a and processing block 31b. Also, second shuttle arm A2 and guide rail 65 of second shuttle arm A2 are provided in a space that is formed by shuttle arm partition wall 111 and shuttle arm partition wall 112 and separated from processing block 31a and processing block 31b, and processing block 32a and processing block 32b.

As described above, since respective shuttle arms A1 and A2 are separated from respective processing blocks 31a, 31b, 32a, and 32b by shuttle arm partition walls 111, 112 and 113, it is possible to separate atmospheres between respective processing blocks 31a, 31b, 32a, and 32b. For this reason, for example, repair of any one of processing blocks 31a, 31b, 32a, and 32b has no effect for the rest of processing blocks 31a, 31b, 32a and 32b in operation because wafer W can be carried within a separated space, and respective processing blocks 31a, 31b, 32a and 32b are separate from each other. As a result, it is possible to continue to carry out substrate processing without stopping the entire liquid processing apparatus 10.

Figure 7:
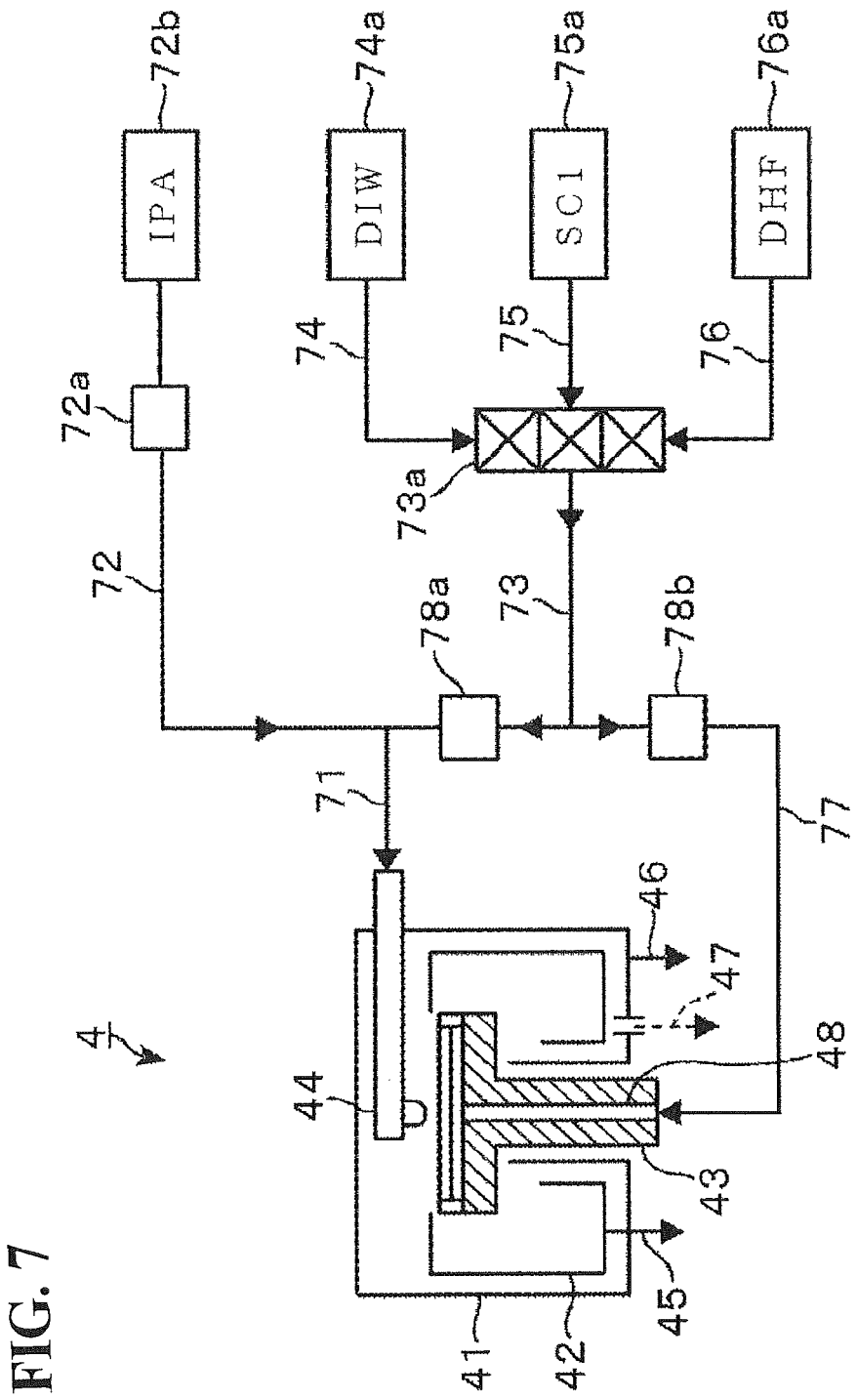
FIG. 7 is an explanatory view illustrating the configuration of a liquid processing unit mounted in the liquid processing apparatus.

Hereinafter, the configuration of liquid processing unit 4 will be described with reference to FIG. 7. Liquid processing unit 4 is a processing unit for carrying out a single-type processing for wafer W, and includes an outer chamber 41 which forms an airtight processing space for performing each processing such as liquid-processing, rinse-cleaning, and shake-drying for wafer W, a wafer holding mechanism 43 provided within outer chamber 41 and for holding wafer W in an almost horizontal state on rotating, a nozzle arm 44 for supplying a liquid to the upper surface side of wafer W held by wafer holding mechanism 43, and an inner cup 42 provided within outer chamber 41 in order to surround wafer holding mechanism 43 and for receiving the liquid scattered to the vicinity from rotating wafer W.

Outer chamber 41 is provided within a case separated from other liquid processing units 4 adjacent to each other. This case is configured to load/unload wafer W through a wafer loading hole (not shown) by a corresponding process arm D11 to D32. In FIG. 7, reference numeral 46 indicates a drainage line for discharging the liquid (such as DIW) stored in a bottom surface of outer chamber 41, and reference numeral 47 indicates an exhaust line for discharging the atmosphere within outer chamber 41. Also, a liquid supply path 48 is formed within wafer holding mechanism 43, so that a liquid can be supplied to the bottom surface of rotating wafer W through liquid supply path 48.

Nozzle arm 44 includes a nozzle for liquid supply at its front end, and is configured to move the nozzle between a center-upper-side position of wafer W held by wafer holding mechanism 43 by a driving mechanism (not shown) and a stand-by position, for example, provided outside of outer chamber 41. Inner cup 42 is raised and lowered between a processing position surrounding wafer W held in wafer holding mechanism 43 and a retreat position retreating toward the lower portion of the processing position, so as to perform a role of receiving various kinds of liquids supplied to the surface of rotating wafer W, and discharging the liquids to the outside of liquid processing unit 4 via a drainage line 45 provided in a bottom surface of inner cup 42.

Hereinafter, a mechanism for supplying a liquid to each liquid processing unit 4 will be described. The nozzle provided in nozzle arm 44 is connected to a supply line 71 at the upper surface side, and supply line 71 at the upper side is split into an IPA supply line 72 and a liquid supply intermediate line 73. IPA supply line 72 is connected to an IPA supply unit 72b via a mass flow controller 72a, and IPA supply unit 72b performs a role of supplying IPA (isopropyl alcohol) which is for drying wafer W to the upper surface of wafer W by using high volatility.

Liquid supply intermediate line 73 is split into three channels of liquid supply lines 74, 75, and 76 via a switch valve 73a. Liquid supply line 74 is connected to a DIW supply unit 74a for supplying a deionized water (DIW) which is a rinsing liquid for removing a diluted hydrofluoric acid (DHF) liquid or a SC1 liquid (ammonia-hydrogen peroxide solution) remaining on wafer W after liquid processing. Also, liquid supply line 75 is connected to an SC1 supply unit 75a for supplying an SC1 liquid which is a chemical liquid for removing particles or organic contaminants on the surface of wafer W, and liquid supply line 76 is connected to a DHF supply unit 76a for supplying a DHF liquid which is an acidic chemical liquid for removing a natural oxide film on the surface of wafer W.

Also, liquid supply intermediate line 73 is connected to liquid supply path 48 for supplying a liquid to the bottom surface of wafer W via a supply line 77 at the bottom surface side. In FIG. 7, reference numerals 78a, and 78b, respectively, indicate mass flow controllers for controlling the amounts of liquids supplied to nozzle arm 44 and wafer holding mechanism 43.

As shown in FIG. 2, a control unit 8 is connected to liquid processing apparatus 10. Control unit 8 includes, for example, a computer including a CPU and a recording unit, and the recording unit has a recipe. The recipe includes a program including a group of organized control steps (commands) for the control related to the operation of liquid processing apparatus 10, from liquid processing of wafer W through loading of wafer W in liquid processing unit 4 of respective liquid processing blocks 31 to 33 to storage of wafer W in carrier C after the liquid processing. The program is, for example, stored in a recording medium, such as a hard disc, a compact disc, a magnet optical disc, and a memory disc, and is installed in a computer therein.

For example, the recipe describes a specific processing block out of processing blocks 31 to 33 where the liquid processing is performed and the kind of liquid processing to be performed with respect to a wafer W of a specific lot. For example, the recipe is made on a case where the same liquid processing is performed in processing blocks 31 to 33 and a case where different liquid processing are performed in processing blocks 31 to 33, respectively. Herein, even though one liquid is used, the liquid processing varies according to liquid processing temperature or liquid processing time.

Hereinafter, an operation of liquid processing apparatus 10 of the present disclosure will be described where the same liquid processing is carried out in first processing block 31 to third processing block 33, by way of example. Wafer W within carrier C loaded into carrier placing block 1 from the outside is transferred to a transfer stage of transfer block 2 by loading/unloading arm B. Herein, since 8 liquid processing units are provided in each of processing blocks 31 to 33, wafers W in the same one lot are divided and transferred to first to third processing blocks 31 to 33, in such a way that, for example, after 8 wafers W are transferred to first processing block 31, 8 wafers W are continuously transferred to second processing block 32, and, then, 8 wafers W are continuously transferred to third processing block 33.

Herein, in carrying of wafers W to first processing block 31, since 4 liquid processing units 4 are provided in each of upper processing block 31a and lower processing block 31b, 4 wafers W within carrier C are carried to upper first transfer stage 21a in transfer block 2 by loading/unloading arm B, and 4 wafers W within carrier C are carried to lower first transfer stage 21b. Then, in first processing block 31, process arm D11 at the upper side takes out wafer W from upper first transfer stage 21a and carries wafer W to a predetermined liquid processing unit 4 where a predetermined liquid processing is carried out. Wafer W which has been subjected to a liquid processing is returned to upper first transfer stage 21a by process arm D11 at the upper side.

Also, in lower processing block 31b, process arm D12 at the lower side takes out wafer W from lower first transfer stage 21b and carries wafer W to a predetermined liquid processing unit 4 where a predetermined liquid processing is carried out. Wafer W which has been subjected to a liquid processing is returned to lower first transfer stage 21b by process arm D12 at the lower side. Then, wafers W disposed on first transfer stages 21a and 21b, which have been subjected to at least a liquid processing, are returned to their original carrier by loading/unloading arm B.

Also, when wafers W are carried to second processing block 32, wafers W within carrier C are transferred to second transfer stage 22 of transfer block 2 by loading/unloading arm B. Then, wafers W on second transfer stage 22 are taken out by first shuttle arm A1 and directly carried to second transfer stage 35a of second processing block 32. Wafers W on second transfer stage 35a are transferred to upper stage 35b and lower stage 35c in order by vertical carrying mechanism E1. Wafers W on upper stage 35b are carried to liquid processing units 4 of upper processing block 32a by upper process arm D21, and are subjected to a predetermined liquid processing. Wafers W which have been subjected to a liquid processing are carried to upper stage 35b by upper process arm D21, and transferred to second transfer stage 35a by vertical carrying mechanism E1.

Meanwhile, Wafers W on lower stage 35c are carried to liquid processing units 4 of lower processing block 32b by lower process arm D22. Wafers W which have been subjected to a liquid processing are carried to lower stage 35c by lower process arm D22, and transferred to second transfer stage 35a by vertical carrying mechanism E1. Wafers W on second transfer stage 35a, which have been subjected to liquid treatments, are carried to second transfer stage 22 of transfer block 2 by first shuttle arm A1, and are returned into their original carrier C by loading/unloading arm B.

In the same way, in carrying of wafers W to third processing block 33, wafers W within carrier C are transferred to third transfer stage 23 of transfer block 2 by loading/unloading arm B. Then, wafers W on third transfer stage 23 are taken out by second shuttle arm A2 and directly carried to third transfer stage 36a of third processing block 33. Wafers W on third transfer stage 36a are transferred to upper stage 36b and lower stage 36c by vertical carrying mechanism E2. Wafers W on upper stage 36b are carried to liquid processing units 4 of upper processing block 33a by upper process arm D31, and are subjected to a predetermined liquid processing. Wafers W which have been subjected to a liquid processing are carried to upper stage 36b by upper process arm D31, and transferred to third transfer stage 36a by vertical carrying mechanism E2.

Meanwhile, Wafers W on lower stage 36c are carried to liquid processing units 4 of lower processing block 33b by lower process arm D32. Wafers W which have been subjected to a liquid processing are carried to lower stage 36c by lower process arm D32, and transferred to third transfer stage 36a by vertical carrying mechanism E2. Wafers W on third transfer stage 36a, which have been subjected to liquid treatments, are directly carried to second transfer stage 22 of transfer block 2 by second shuttle arm A2, and are returned into their original carrier C by loading/unloading arm B.

As described above, it may be possible that after wafers W are carried to all liquid processing units of first processing block 31, wafers W are carried to all liquid processing units of second processing block 32, and then wafers W are carried to third processing block 33. Also, wafers W may be carried to second processing block 32 and third processing block 33 in order. The order of carrying of wafers W is appropriately determined according to the time of processing performed in a liquid processing unit, or the number of processed wafers W, or the like.

Hereinafter, one example of a liquid processing performed in each of liquid processing units 4 will be described with reference to liquid processing unit 4 provided in upper processing block 31a of first processing block 31. In upper processing block 31a, process arm D11 which has taken wafer W from upper stage 35b proceeds into one of liquid processing units 4 and transfers wafer W to wafer holding mechanism 43. Then, nozzle arm 44 is moved to a center-upper-side position of wafer W, and inner cup 42 is raised up to a processing position. Then, wafer W is rotated by wafer holding mechanism 43 while a SC1 liquid is supplied to both sides of upper/lower surfaces of wafer W via a nozzle and liquid supply path 48 at wafer holding mechanism 43 side. Accordingly, a liquid film of a chemical liquid is formed on wafer W, and thereby alkaline chemical liquid cleaning is carried out.

When the alkaline chemical liquid cleaning is completed, inner cup 42 is moved to a retreat position. Then, rinse-cleaning for removing the SC1 liquid on the surface of wafer W is carried out by supplying DIW to the nozzle and liquid supply path 48 of wafer holding mechanism 43. When the rinse-cleaning is completed, wafer W is shake-dried, and then inner cup 42 is raised to the processing position again. Then, wafer W is rotated while a DHF liquid is supplied to upper/lower surfaces of wafer W via the nozzle and liquid supply path 48 of wafer holding mechanism 43. Thus, a liquid film of the DHF liquid is formed on these surfaces, and thereby acidic chemical liquid cleaning is carried out. Then, after a predetermined time is elapsed, inner cup 42 is lowered to a retreat position, and the liquid supply system is switched to the DI water so as to carry out the rinse-cleaning again.

Subsequently, inner cup 42 is raised to the processing position and IPA is supplied to the upper surface of liquid processing unit 4 while wafer W is rotated so as to carry out IPA-drying by using volatility of IPA. Thus, the DI water remaining on the surface of wafer W after rinsing is completely removed. Thereafter, inner cup 42 is retreated to the retreat position, and a loading/unloading hole (not shown) is opened, thereby allowing process arm D11 to enter into liquid processing unit 4. Process arm D11 then unloads wafer W which has been subjected to a treatment, and transfers wafer W to upper stage 35b.

According to the embodiment as described above, liquid processing apparatus includes first processing block 31, second processing block 32, and third processing block 33. And wafer W is transferred from the substrate loading block by loading/unloading arm B is directly carried to second processing block 32 and third processing block 33 by first shuttle arm A1 and second shuttle arm A2, respectively. For this reason, wafer W in the substrate loading block can be quickly carried to second processing block 32 and third processing block 33, thereby achieving an improvement in throughput.

In other words, shuttle arms A1 and A2 are carrying mechanisms dedicated to carrying wafer W between transfer block 2 and processing blocks 32 and 33, respectively, and thus each of shuttle arms A1 and A2 can independently carry wafer W without interference with a carrying operation by process arm D in another processing block. For this reason, wafer W can be transferred from transfer block 2 to second and third processing blocks 32 and 33 at a high speed, so that the throughput can be improved as described above.

Also, wafer W can be independently carried to each of first processing block to third processing block 31 to 33 as described above. Thus, even if a problem occurs in one of processing blocks, it is possible to continue to carry out processing in other processing blocks. For example, when a problem occurs in first processing block 31, wafer W may be carried to second processing block 32 and third processing block 33 to be processed. Also, when a problem occurs in second processing block 32, wafer W may be carried to first processing block 31 and third processing block 33 to be processed. For this, for example, when a problem occurs in a processing block, control unit 8 stops the driving of a process arm in the corresponding processing block where the problem occurs, and controls the transfer of wafer W by loading/unloading arm B in such a way that wafer W cannot be carried to a transfer stage of the corresponding processing block from transfer block 2.

As described above, even if a problem occurs in one of processing blocks, it is possible to continue to carry out processing in other processing blocks. Thus, it is possible to suppress the reduction in the operation rate of the apparatus without stopping the entire apparatus.

Also, since wafer W can be independently carried to each of first processing block 31 to third processing block 33, it is possible to select processing blocks to be driven in accordance with the number of wafers W to be processed. For example, when few wafers are to be processed in a process, it is possible to drive only first processing block 31, or only first processing block 31 and second processing block 32. In this case, for example, control unit 8 has to have a recipe for allowing only first processing block 31 to be used, or a recipe for allowing only first processing block 31 and second processing block 32 to be used. As a result, by the selection of such a recipe, the driving of loading/unloading arm B, process arms D11, D12, D21, and D22, vertical carrying mechanism E1, or corresponding liquid processing units can be controlled. In this case, although there may exist processing block(s) of non-operation, the operation cost may be reduced since there is no need to unnecessarily move process arm D.

Also, in the embodiment as described above, second processing block 32 and third processing block 33 have the same configuration. The addition of a processing block having the same configuration may further increase the number of liquid processing units. When a new processing block is added as described above, for example, a shuttle arm dedicated to a direct carrying of wafer W between transfer block 2 and the new processing block is provided at a position above second shuttle arm A2 and without interference with upper process arms of first to third processing blocks 31 to 33.

Also, in liquid processing apparatus 10 of the present disclosure, in first processing block 31 to third processing block 33, different liquid processing may be carried out as described above. In this case, as described above, since the recipe describes a designated processing block to which wafer W of a lot is carried and the kind of liquid processing to be performed in the processing block, wafer W of the lot is carried to the corresponding processing block.

When different liquid processing are carried out in each of first processing block 31 to third processing block 33, wafers W of respective carriers C1 to C3 are carried to corresponding processing blocks 31 to 33 in such a way that, for example, wafers W1 of carrier C1 can be subjected to liquid processing in first processing block 31, wafers W2 of carrier C2 can be subjected to liquid processing in second processing block 32, and wafers W3 of carrier C3 can be subjected to liquid processing in third processing block 33.

Herein, it may be possible that all wafers W1 within carrier C1 are transferred to first processing block 31 in order and subjected to a predetermined liquid processing, and then wafers W1 which have been subjected to liquid processing are returned into carrier C1, and then all wafers W2 (W3) within carrier C2 (C3) are transferred to second processing block 32 (third processing block 33) in order, where a predetermine liquid processing is carried out. Then, wafers W2 (W3) which have been subjected to liquid processing are returned into carrier C2 (C3). Also, wafers W1 within carrier C1 may be transferred to all liquid processing units 4 within first processing block 31, and wafers W2 (W3) within carrier C2 (C3) may be transferred to second processing block 32 (third processing block 33) in order so that different liquid processing can be simultaneously carried out in all processing blocks 31 to 33 in parallel. Herein, wafers W may be carried to third processing block 33 after liquid processing units of second processing block 32 are completely filled up, or wafers W may be carried to second processing block 32 and third processing block 33 in order. The order of carrying of wafers W is appropriately determined according to the time of processing performed in a liquid processing unit, or the number of processed wafers W, or the like.

In such an embodiment, since each processing can be carried out in each of first processing block 31 to third processing block 33, a processing block to be used can be selected according to a process. For example, a lot having a relatively small number of sheets to be processed can be subjected to a processing by using one processing block. This can improve the operation rate of an apparatus.

Figure 8:
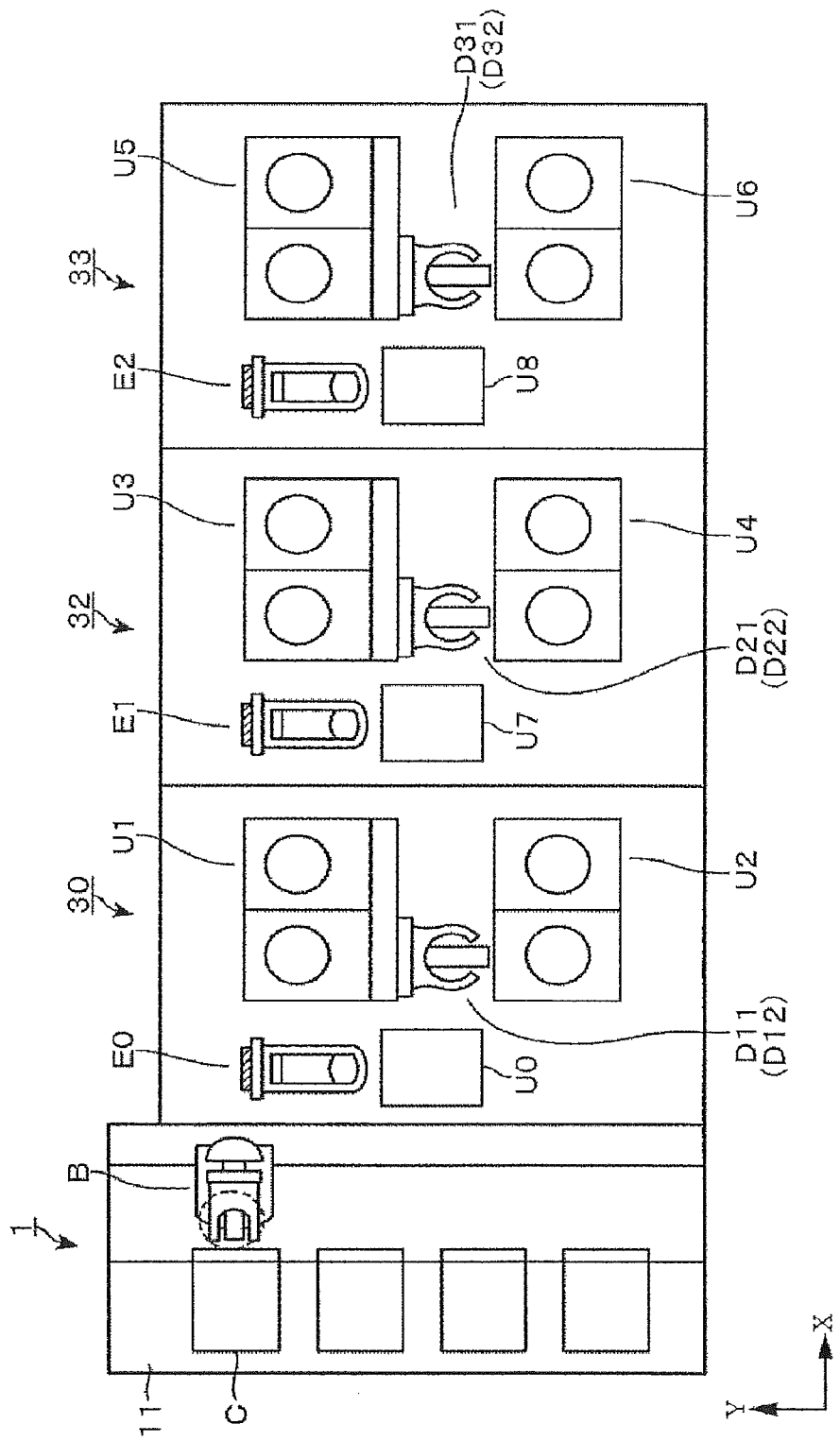
FIG. 8 is a cross-sectional plan view illustrating a liquid processing apparatus according to another exemplary embodiment of the present disclosure.
Figure 9:
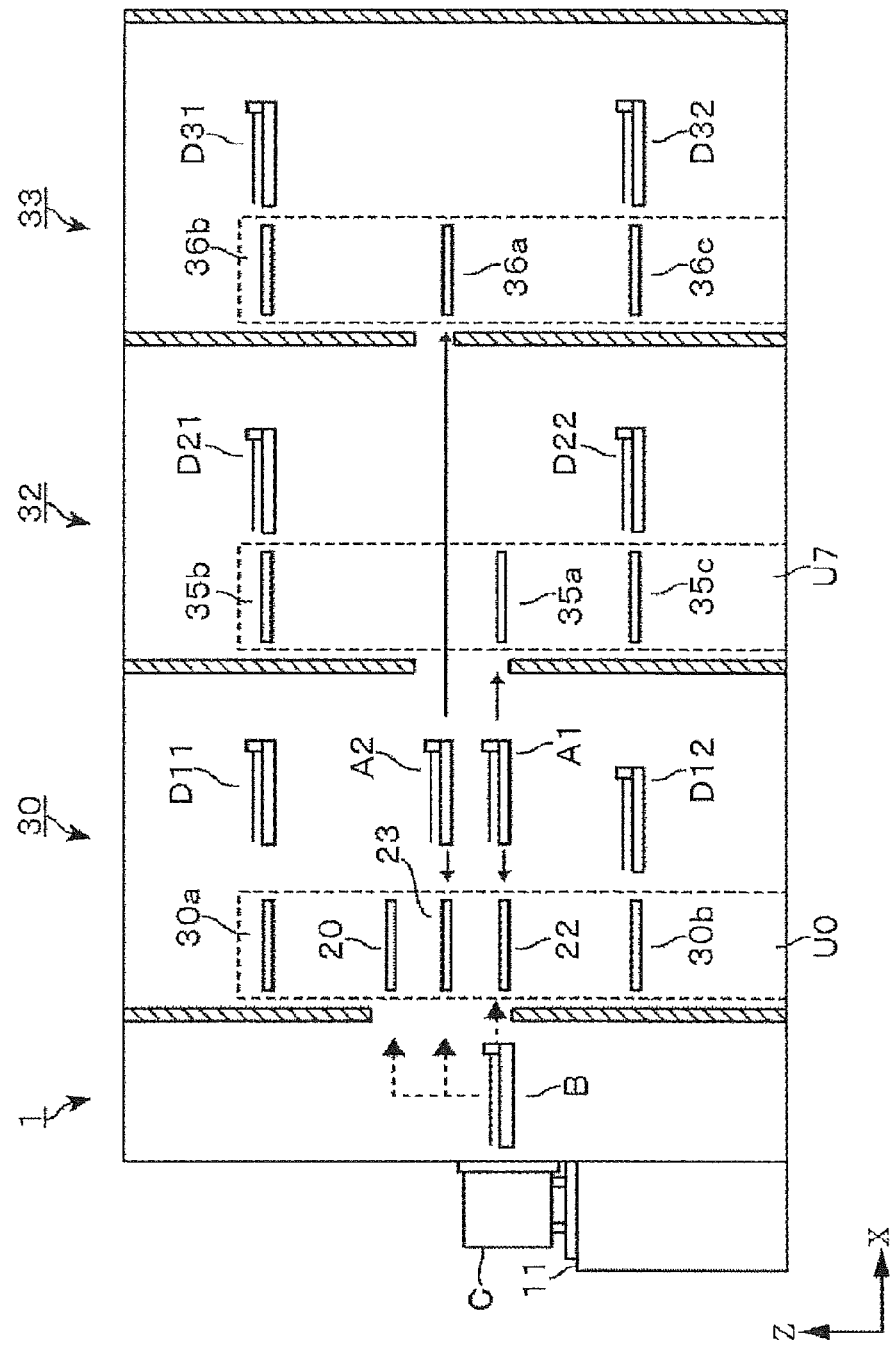
FIG. 9 is a vertical-sectional side view illustrating the liquid processing apparatus according to another exemplary embodiment.

As described above, in the present disclosure, as shown in FIGS. 8 and 9, first processing block may have the same configuration as those of second and third processing blocks. In the present embodiment, at the rear end of carrier placing block 1, first processing block 30 is connected. Also, in first processing block 30, in an area to be accessed by loading/unloading arm B of carrier placing block 1, a transfer shelf unit U0 having multi-stage disposed transfer stages is provided, In transfer shelf unit U0, first transfer stage 20 for transferring wafer W to/from loading/unloading arm B is provided.

In the upper side of transfer shelf unit U0, an upper stage 30a is provided to transfer wafer W to upper process arm D11, and in the lower side, a lower stage 30b is provided to transfer wafer W to lower process arm D12. Also, between first transfer stage 20, upper stage 30a, and lower stage 30b of transfer shelf unit U0, wafer W is transferred by vertical carrying mechanism E0. In the present embodiment, carrier placing block 1 constitutes a substrate loading block. Also, second transfer stage 22 and third transfer stage 23, which transfer wafer W to/from loading/unloading arm B, are provided in transfer shelf unit U0 of first processing block 30. Other configurations are the same as those in the above described embodiment, and the same reference numerals as those in the above-mentioned embodiment refer to the same elements.

In the embodiment, in transferring of wafers W to first processing block 31, wafers W within carrier C loaded to carrier placing block 1 from the outside are transferred to first transfer stage 20 of first processing block 30 by loading/unloading arm B. Wafers W on transfer stage 20 are transferred to upper stage 30a and lower stage 30b in order by vertical carrying mechanism E0. Also, wafers W on upper stage 30a are carried to liquid processing units 4 of upper processing block 31a by upper process arm D11, and wafers W on lower stage 30b are carried to liquid processing units 4 of lower processing block 31b by lower process arm D12, and then predetermined liquid processing are carried out for wafers W, respectively. Wafers W which have been subjected to liquid processing are carried to upper stage 30a or lower stage 30b by respective process arms D11 and D12, transferred to first transfer stage 20 by vertical carrying mechanism E0, and returned into carrier C by loading/unloading arm B.

Also, in carrying of wafers W to second processing block 32 (third processing block 33), wafers W within carrier C are transferred to second transfer stage 22 (third transfer stage 23) of first processing block 30 by loading/unloading arm B. Then, wafers W on transfer stage 22 (23) are taken by first shuttle arm A1 (second shuttle arm A2) and directly carried to second transfer stage 35a of second processing block 32 (third transfer stage 36a of third processing block 33. The subsequent steps are the same as those in the above described embodiment.

In such a configuration, the vertical-directional movement distance of loading/unloading arm B may be short, and first processing block 30 to third processing block 33 may have liquid processing units, a transfer shelf unit, and process arms with the same configurations. Thus, it is advantageous to readily design and manufacture the apparatus.

Figure 10:
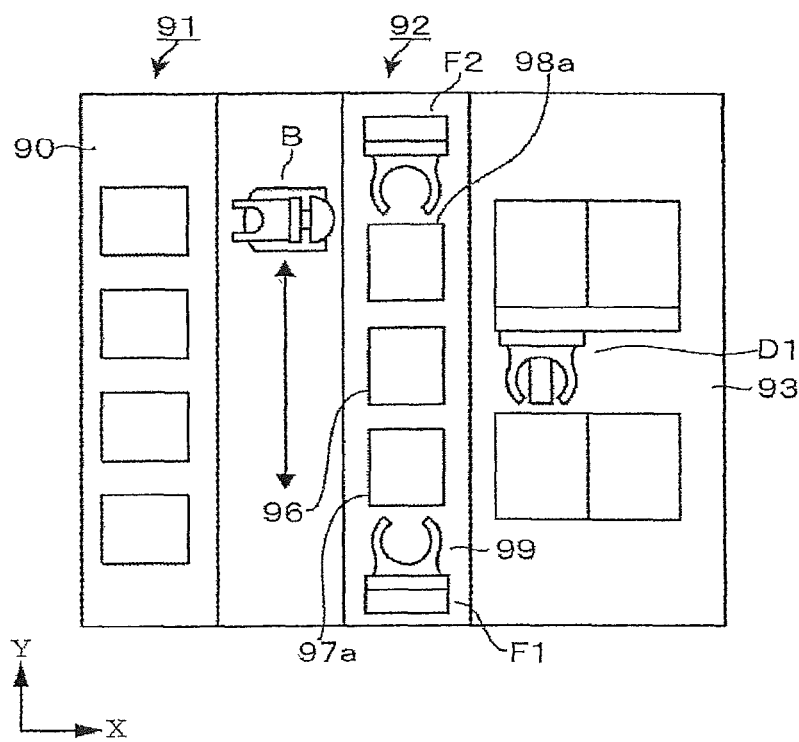
FIG. 10 is a cross-sectional plan view illustrating a liquid processing apparatus according to a further exemplary embodiment of the present disclosure.
Figure 11:
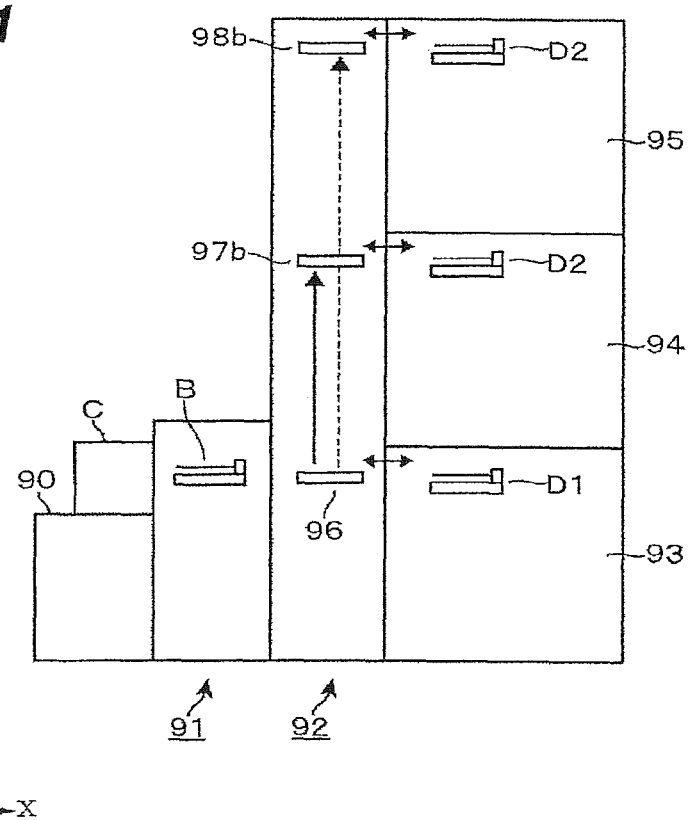
FIG. 11 is a vertical-sectional side view illustrating the liquid processing apparatus according to a further exemplary embodiment.

Also, in the present disclosure, as shown in FIGS. 10 and 11, first to third processing blocks may be stacked each other in up and down directions. In the drawings, reference numeral 91 indicates a carrier placing block, and reference numeral 92 indicates a transfer block. They constitute a substrate loading block. Also, in the drawings, reference numeral 90 indicates a carrier placing unit constituting a container placing unit. At the rear end of transfer block 92, a first processing block 93, a second processing block 94, and a third processing block 95 are provided in order to be stacked in this order from below.

In transfer block 92, a first transfer stage 96 for transferring wafer W from loading/unloading arm B constituting a transfer mechanism to first processing block 93, a second transfer stage 97a for transferring wafer W from loading/unloading arm B to second processing block 94, and a third transfer stage 98a for transferring wafer W from loading/unloading arm B to third processing block 95 are provided in a row in the disposition direction of carrier C (in the Y direction in FIG. 10). In this embodiment, loading/unloading arm B is configured to be advanced/retreated, rotated around a vertical shaft, and moved in left/right directions (in the Y direction in FIG. 10).

Also, an upper-side transfer stage 97b is provided above second transfer stage 97a in transfer block 92, at the position corresponding to second processing block 94. Also, a first direct carrying mechanism F1 for directly carrying wafer W between to second transfer stage 97a and upper-side transfer stage 97b is provided.

Also, an upper-side transfer stage 98b is provided above third transfer stage 98a in transfer block 92, at the position corresponding to third processing block 95. Also, a second direct carrying mechanism F2 for directly carrying wafer W between third transfer stage 98a and upper-side transfer stage 98b is provided. These first and second direct carrying mechanisms F1 and F2 are configured in such a way that a holding arm 99 for holding wafer W can be advanced/retreated and moved up/down.

Meanwhile, a plurality of processing units 100 for performing a processing on wafers W, and substrate carrying mechanisms D1 to D3 for transferring wafer W to processing units 100 are provided in each of first processing block 93, second processing block 94, and third processing block 95. Then, it is configured that in first to third processing blocks 93 to 95, wafers W can be transferred between corresponding transfer stage 96 and corresponding upper-side transfer stages 97b and 98b by substrate carrying mechanisms D1 to D3.

In the embodiment, although first to third processing blocks 93 to 95 are disposed in up and down directions, a sequential disposition from the substrate loading block side means that the processing blocks are disposed in order from an area accessed by a transfer mechanism (loading/unloading arm B) of the substrate loading block. In the embodiment, since loading/unloading arm B is not moved in an up/down direction, the area accessed by arm B is an area in which wafer W can be transferred to/from process arm D1 of first processing block 93. From the area, second processing block 94 and third processing block 95 are upwardly disposed in order.

In such a configuration, wafers W within carrier C are transferred to first to third transfer stages 96, 97a, and 98a in order by loading/unloading arm B, and wafers W on first transfer stage 96 are taken out by substrate carrying mechanism D1 of first processing block 93, and transferred into first processing block 93. Also, wafers W on second transfer stage 97a are carried to upper-side transfer stage 97b by first direct carrying mechanism F1, and are taken out by substrate carrying mechanism D2 of second processing block 94, and transferred into second processing block 94. Also, wafers W on third transfer stage 98a are carried to upper-side transfer stage 98b by second direct carrying mechanism F2, and are taken by substrate carrying mechanism D3 of third processing block 95, and transferred into third processing block 95.

In such an embodiment, since wafers W are directly carried from transfer block 2 to second processing block 94 and third processing block 95 by first and second direct carrying mechanisms F1, and F2, Wafers W may be smoothly transferred to respective processing blocks, thereby achieving improvement in throughput. Also, wafer W can be independently carried to each of first processing block to third processing block 93 to 95. Thus, even when a problem occurs in one of processing blocks, it is possible to continue to carry out a processing in other processing blocks, thereby suppressing the reduction in the operation rate of the apparatus. Also, in the embodiment, since processing blocks are stacked in multi-stages, it is advantageous in that although liquid processing units are increased, it is possible to suppress the enlargement in a footprint of the apparatus.

Although, in the configuration as described above, liquid processing units having the same configuration are mounted as processing units, it is possible to mount processing units having different configurations (such as a surface cleaning unit for cleaning the surface side of wafer W, a back cleaning unit for cleaning the back side of wafer W, and a reversing unit of wafer W) in one processing block. Herein, the kind, and the number of processing units mounted in first to third processing blocks are the same as those in the layout.

Also, although in the above described embodiment, only one holding arm is provided in a direct carrying mechanism, it is possible to provide a plurality of holding arms so as to take a plurality of wafers W from one transfer stage at once, and to transfer them to another transfer stage. Also, loading/unloading arm B for loading/unloading wafer W from carrier C may be provided with a plurality of holding arms 12.

Also, although in the embodiment as described above, only one wafer W is disposed on upper stages 35b and 36b, or lower stages 35c and 36c of transfer shelf units U7 and U8, and second and third transfer stages 35a and 36a and transfer stages 22 and 23 of transfer block 2, it is possible to dispose a plurality of wafers W in multi stages, and a buffer of wafers W may be provided in an area accessed by a vertical carrying mechanism.

Also, between loading/unloading arm B of a substrate loading block, and shuttle arms A1 and A2 (first and second direct carrying mechanisms F1 and F2), wafer W may be directly transferred between holding arms, without setting up of a transfer stage.

Also, the processing using a fluid is not limited to the above described liquid processing, and may be applied to, for example, a processing apparatus for hydrophobizing the surface of wafer W by supplying a vapor, such as hexamethyldisilazane (HMDS), on wafer W.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A substrate processing apparatus comprising:
    a substrate loading block including a container placing unit in which a substrate carrying container storing at least a substrate is disposed and a transfer mechanism to transfer the substrate with respect to the substrate carrying container disposed on the container placing unit;
    a first processing block, a second processing block, and a third processing block disposed in an order from the side of the substrate loading block, each of which is a processing block including a plurality of processing units to perform processing on the substrate and a substrate carrying mechanism to transfer the substrate with respect to the processing units;
    a first transfer stage to dispose a substrate transferred from the substrate carrying container by the transfer mechanism to be transferred to the first processing block;
    a second transfer stage to dispose a substrate from the substrate carrying container by the transfer mechanism to be transferred to the second processing block;
    a third transfer stage to dispose a substrate from the substrate carrying container by the transfer mechanism to be transferred to the third processing block;
    a first direct carrying mechanism to directly carry the substrate from the second transfer stage to the second processing block; and
    a second direct carrying mechanism to directly carry the substrate from the third transfer stage to the third processing block,
    wherein each of the first direct carrying mechanism and the second direct carrying mechanism is a dedicated carrying mechanism configured to carry the substrate directly and exclusively to the second processing block and to the third processing block, respectively.

2. The substrate processing apparatus as claimed in claim 1, wherein the first processing block, the second processing block, and the third processing block are disposed in a horizontal direction one another.

3. The substrate processing apparatus as claimed in claim 1, wherein the second processing block includes a transfer stage to transfer the substrate from/to the first direct carrying mechanism, and the third processing block includes a transfer stage to transfer the substrate from/to the second direct carrying mechanism.

4. The substrate processing apparatus as claimed in claim 1, wherein each of the first processing block, the second processing block, and the third processing block includes an upper processing block and a lower processing block which are stacked each other,
    each of the upper processing block and the lower processing block includes a plurality of processing units to perform processing on the substrate and a substrate carrying mechanism to transfer the substrate to the processing units, and
    each of the second processing block and the third processing block includes an upper stage to which the substrate is transferred by the substrate carrying mechanism of the upper processing block, a lower stage to which the substrate is transferred by the substrate carrying mechanism of the lower processing block, and a vertical carrying mechanism to transfer the substrate carried by the first direct carrying mechanism or the second direct carrying mechanism to the upper stage or the lower stage.

5. The substrate processing apparatus as claimed in claim 1, wherein each of the first processing block, the second processing block, and the third processing block includes an upper processing block and a lower processing block which are stacked each other,
    each of the upper processing block and the lower processing block comprises a plurality of processing units to perform processing on the substrate, and a substrate carrying mechanism to transfer the substrates to the processing units, and
    each of the second processing block and the third processing block includes an upper stage to which the substrate is transferred by the substrate carrying mechanism of the upper processing block, a lower stage to which the substrate is transferred by the substrate carrying mechanism of the lower processing block, a vertical carrying mechanism to transfer the substrate carried by the first direct carrying mechanism or the second direct carrying mechanism to the upper stage or the lower stage, and a transfer stage to transfer the substrate between substrates carried by the first direct carrying mechanism or the second direct carrying mechanism and the vertical carrying mechanism.

6. The substrate processing apparatus as claimed in claim 1, further comprising a transfer block between the substrate loading block and the first processing block,
    wherein the transfer block includes the first transfer stage, the second transfer stage to transfer the substrate between the transfer mechanism and the first direct carrying mechanism, and the third transfer stage to transfer the substrate between the transfer mechanism and the second direct carrying mechanism.

7. The substrate processing apparatus as claimed in claim 1, wherein partition walls are provided between the first processing block, the second processing block, and the third processing block, and the partition walls includes an opening allowing the substrate to be transferred to each of the processing blocks by the first direct carrying mechanism or the second direct carrying mechanism.

8. The substrate processing apparatus as claimed in claim 1, wherein a partition wall is provided between the first processing block and the second processing block, and the partition wall includes an opening allowing the substrate to be transferred to the second processing block by the first direct carrying mechanism and allowing the second direct carrying mechanism to be passed through.

9. The substrate processing apparatus as claimed in claim 1, wherein the substrate is transferred between the substrate carrying mechanism included within the first processing block, and the first transfer stage.

10. The substrate processing apparatus as claimed in claim 1, wherein the first direct carrying mechanism or the second direct carrying mechanism is capable of carrying a plurality of substrates at once.

11. The substrate processing apparatus as claimed in claim 1, wherein each of the first direct carrying mechanism and the second direct carrying mechanism has partition walls formed at upper side and at lower side.

\* \* \* \* \*